United States Patent [19]

Gates

[11] Patent Number: 5,110,299

[45] Date of Patent: May 5, 1992

[54] HIGH DENSITY INTERCONNECT

[75] Inventor: James L. Gates, Vista, Calif.

[73] Assignee: Hughes Aircraft Company, Los Angeles, Calif.

[21] Appl. No.: 486,669

[22] Filed: Feb. 28, 1990

[51] Int. Cl.⁵ .............................................. H01R 9/09
[52] U.S. Cl. ....................................... 439/68; 29/876; 29/842; 439/69; 439/886
[58] Field of Search ................... 439/68, 69, 886, 887; 29/872, 846, 842

[56] References Cited

U.S. PATENT DOCUMENTS 4,239,312 12/1980 Myer et al. ............................ 439/69

FOREIGN PATENT DOCUMENTS 1178533 9/1964 Fed. Rep. of Germany ...... 439/886

Primary Examiner—Paula A. Bradley
Attorney, Agent, or Firm—W. C. Schubert; W. K. Denson-Low

[57] ABSTRACT

A pair of elongated rectangular metallic bumps are formed on two separate surfaces. The bumps are aligned orthogonally prior to being merged by hybridization to form a high density hybrid assembly. Translational misalignment does not change the interconnect area. Rotational misalignment causes only a slight change in the interconnect area. The bump surface area is increased by merging the bumps. This reduces the hybridization pressure which prevents the interconnect area from increasing in size, commonly known as mash out. The invention makes high density hybrid assemblies practical because it reduces the risk of short circuits between adjacent interconnects and results in a high yield in production.

12 Claims, 1 Drawing Sheet

HIGH DENSITY INTERCONNECT

BACKGROUND

The present invention relates to semiconductor hybrid arrays and, more particularly, to bump interconnects for high density hybrid arrays.

Typically, in fabricating hybrids such as those used in a focal plane array, a matrix of photodetectors is interconnected with a readout array by bump interconnects. The interconnects are typically metallic bumps that are formed on two separate surfaces. The present state of the art for high density semiconductor hybrid arrays may provide, for example, a 128×128 array of detectors on 40 micron centers, with each detector being on the order of 40 micrometers or smaller.

Conventional bumps used in hybrid construction have a round shape. Any misalignment (translational or rotational) drastically changes the interconnect area and thus the pressure applied to the hybrid assembly. Misalignment causes slippage during assembly. In high density hybrid construction, round bumps suffer from excessive "mash out" which produces an increase in size of the formed interconnect. This causes adjacent bumps to short out. Because of these disadvantages, high density hybrid assemblies using conventional round bump interconnects typically have a low yield in production.

Accordingly, it is an objective of the present invention to provide interconnect bumps for high density hybrids that have a high yield in production. Another objective of the invention is the provision of bump interconnects for high density hybrids that do not suffer from misalignment due to excessive "mash out" and slippage. A further objective of the present invention is to provide for mating interconnect bumps on two adjacent surfaces without resulting in a reduced interconnect area after merging. Yet another objective of the invention is the provision of a high density interconnect arrangement for hybrid semiconductor arrays which reduces the risk of electrical short circuits between adjacent interconnect bumps.

SUMMARY OF THE INVENTION

In accordance with the present invention, there are provided interconnect bumps having rectangular shapes for use in a hybrid array construction, such as for integrated circuit devices including semiconductor and focal plane array devices, and thin film superconducting devices, and the like. The bumps are typically metallic and are formed on two separate facing surfaces. At interconnect, the bumps are aligned orthogonal to each other. Then the bump surfaces are merged. The bump surface area is increased after the bumps are merged. This reduces hybridization pressure which prevents additional "mash out". Any translational misalignment does not change the interconnect area. Any rotational misalignment causes only a small change in the interconnect area. The surface area of the formed interconnect is maintained substantially constant irrespective of relative alignment of the respective bumps. This invention makes high density hybrid assemblies practical because it increases yield over high density hybrid assemblies made with round bumps.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
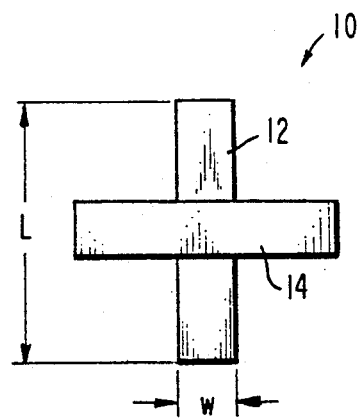
FIG. 1 is a top view of two orthogonally aligned rectangular bumps prior to hybridization.

Referring now to the drawings, FIG. 1 is a top view of an interconnect 10 prior to hybridization. It will be understood that FIG. 1 is a greatly enlarged or magnified view of a single interconnect 10 in an array prior to hybridization. A hybrid array may have on the order of from 500×500 to 1000×1000 or more such interconnects 10, for example. The interconnect 10 typically may be as small as 20 micrometers or less, and the array of such interconnects 10 may be spaced on 20 micron centers, for example. Thus, there is a high density of extremely minute interconnects 10, each spaced from its neighbor by a very small dimension.

Bottom and top interconnect bumps 12, 14 in accordance with the invention are shown orthogonally aligned prior to being merged under pressure by hybridization. The bumps 12, 14 are metallic, and may be made of a material such as indium, for example. The bumps 12, 14 are formed on two separate surfaces which are brought together, aligned and subjected to pressure to merge the bumps 12, 14 and form a hybrid assembly. The bumps 12, 14 are formed using conventional photolithographic and deposition techniques and equipment commonly employed in integrated circuit processing, for example. One of the surfaces may be a focal plane array made up of a plurality of photodetectors, for example, while the other surface may be a mating readout array made up of a plurality of readout cells, for example. When the two surfaces are mated or hybridized, they comprise a high density hybrid assembly. However, it is to be understood that the present invention is not limited only to hybrid focal plane arrays, but may be employed with hybrid array construction used in semiconductor and focal plane array devices, and superconducting devices, and the like, for example.

The bumps 12, 14 have a rectangular shape or configuration. At interconnect, they are placed and oriented substantially orthogonal to each other. The length or longest dimension (L) of each bump 12, 14 typically may be as small as 10-20 micrometers, or less, while the width (W) of each bump 12, 14 may be on the order of from 2-4 microns, for example.

Heretofore, conventional bumps used in hybrid construction had a round shape. Any misalignment, either translational or rotational, drastically changed the interconnect area, and thus the pressure applied to the hybrid assembly. Misalignment caused slippage during assembly, also. Furthermore, in high density hybrid construction, round bumps are subject to excessive "mash out", an increase in size causing adjacent bumps to short circuit to each other. The rectangular bumps 12, 14 of the present invention overcome these difficulties encountered when using conventional round bumps.

Figure 2:
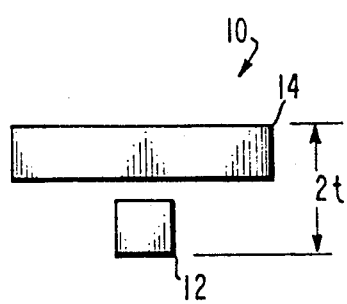
FIG. 2 is a side view of the two aligned bumps of FIG. 1 prior to hybridization.

As may be seen in FIG. 1, when the two rectangular bumps 12, 14 are aligned substantially orthogonal with respect to each other prior to hybridization, any translational misalignment does not change the area of the interconnect 10. The width of each bump 12, 14 is W, and the area of the interconnect 10 is $W^2$. Any rotational misalignment prior to hybridization causes only a small change in the area of the interconnect 10. With reference to FIG. 2 which is a side view of the interconnect 10 to FIG. 1, the thickness of the interconnect 10 prior to hybridization is approximately equal to 2t, or twice the thickness (t) of one of the bumps 12, 14.

Figure 3:
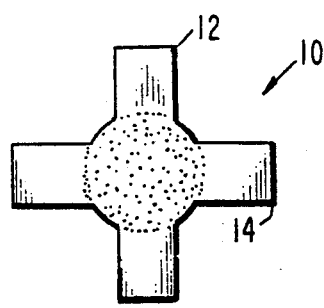
FIG. 3 is a plan view of the two bumps after hybridization showing the merged bump surfaces.
Figure 4:
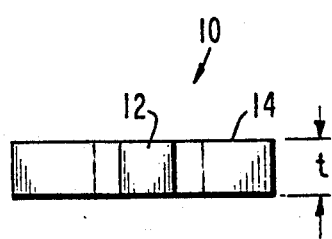
FIG. 4 is a side view of the two bumps of FIG. 3 after hybridization.

Referring now to FIG. 3, there is shown a plan view of the interconnect 10 after hybridization illustrating how the surfaces of the two bumps 12, 14 are merged together. FIG. 4 shows a side view of the interconnect 10 of FIG. 3. The area of the electrical interconnect 10 after hybridization is approximately equal to $2W^2$. The thickness of the interconnect 10 is reduced to t. The surface area of the interconnect 10 is increased after the bumps 12, 14 are merged together. The new area is approximately $2LW+W^2$ which reduces hybridization pressure, thus preventing additional "mash out". The surface area of the formed interconnect 10 is maintained substantially constant irrespective of relative alignment of the respective bumps 12, 14.

The rectangular bumps 12, 14 of the present invention make high density hybrid assemblies practical because when they are used, the yield is increased over high density hybrid assemblies made with conventional round bumps. The rectangular bumps 12, 14 of the present invention may be used with many contemporary high density hybrid semiconductor assemblies such as focal plane arrays, for example. The hybrid arrays may be assembled using commercially available equipment such model M8 or M9 hybridization equipment, manufactured by Research Devices, for example.

Thus there has been described a new and improved bump interconnect for high density semiconductor hybrid arrays. High density hybrid assemblies made with the rectangular bumps of the present invention have a high yield in production. The bump interconnects of the present invention do not suffer from misalignment due to excessive "mash out" and slippage. Interconnect bumps on two adjacent surfaces may be mated without resulting in a reduced interconnect area after merging. The bumps of the present invention may be used in high density interconnect hybrids without running the risk of electrical short circuits between adjacent interconnect bumps.

It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A bump interconnect for use in a high density hybrid semiconductor array, said interconnect comprising:
   a first elongated, generally rectangular bump disposed on a first surface; and
   a second elongated, generally rectangular bump disposed on a second surface;
   the second bump being aligned substantially orthogonal to the first bump, the first and second bumps being merged under hybridization pressure to form the interconnect, the thickness of the interconnect being approximately equal to the thickness of one of the bumps prior to merging.

2. The interconnect of claim 1 wherein the first and second elongated bumps comprise:
   a first elongated, generally rectangular metallic bump disposed on a first surface; and
   a second elongated, generally rectangular metallic bump disposed on a second surface.

3. The interconnect of claim 1 which further comprises:
   a first array of elongated bumps disposed on a first surface;
   a second array of elongated bumps disposed on a second surface and substantially aligned with the first array, the first and second bumps being merged under hybridization pressure to form the interconnect.

4. The interconnect of claim 3 wherein the first and second arrays of bumps are merged under hybridization pressure to form the interconnect such that the thickness of the interconnect is approximately equal to the thickness of a single bump prior to merging.

5. A bump interconnect arrangement for use in a high density hybrid array, said interconnect comprising:
   a first elongated, generally rectangular metallic bump disposed on a first surface; and
   a second elongated, generally rectangular metallic bump disposed on a second surface;
   the second bump being aligned approximately orthogonal to the first bump, the first and second bumps being merged under hybridization pressure to form the interconnect, the thickness of the interconnect being approximately equal to the thickness of one of the bumps prior to merging;
   whereby the surface area of the bump interconnect is maintained substantially constant irrespective of relative alignment of the respective bumps, which interconnect provides for reduced hybridization pressure and minimal mash out.

6. A bump interconnect arrangement for use in a high density hybrid array, said interconnect comprising:
   a first array of elongated, generally rectangular metallic bumps disposed on a surface of a focal plane array; and
   a second array of elongated generally rectangular metallic bumps disposed on a surface of a readout array;
   the second array of bumps being aligned approximately orthogonal to the first array of bumps, the first and second array of bumps being merged under hybridization pressure to form the interconnect arrangement, the thickness of the interconnects of the arrangement being approximately equal to the thickness of one of the bumps prior to merging;
   whereby the surface areas of the respective merged bumps of the bump interconnect arrangement are maintained substantially constant irrespective of relative alignment of the respective bumps.

7. A bump interconnect for use in a high density hybrid semiconductor array, said interconnect comprising:
   a first elongated, generally rectangular, deformable and essentially inelastic metallic bump disposed on a first surface; and a second elongated, generally rectangular, deformable and essentially inelastic metallic bump disposed on a second surface;

the second bump being aligned substantially orthogonal to the first bump, the first and second bumps being merged under hybridization pressure to form the interconnect, the thickness of the interconnect being approximately equal to the thickness of one of the bumps prior to merging.

8. A method of forming a bump interconnect for use in a high density hybrid array, said method comprising the steps of:

provided a first elongated bump disposed on a first surface;

providing a second elongated bump disposed on a second surface;

aligning the second bump substantially orthogonal to the first bump; and merging the first and second bumps under hybridization pressure to form the interconnect.

9. The method of claim 8 wherein the steps of providing the first and second elongated bumps comprise the steps of:

providing a first elongated, generally rectangular bump disposed on a first surface; and providing a second elongated, generally rectangular bump disposed on a second surface.

10. The method of claim 8 wherein the steps of providing the first and second elongated bumps comprise the steps of:

providing a first elongated, generally rectangular metallic bump disposed on a first surface; and providing a second elongated, generally rectangular metallic bump disposed on a second surface.

11. The method of claim 8 which further comprises the steps of:

providing a first array of elongated bumps disposed on a first surface;

providing a second array of elongated bumps disposed on a second surface;

aligning the first and second arrays; and merging the first and second bumps under hybridization pressure to form the interconnect.

12. The method of claim 11 wherein the merging steps comprises the step of:

merging the first and second bumps under hybridization pressure to form the interconnect such that the thickness of the interconnect is approximately equal to the thickness of one of the bumps prior to merging.

* * * * *